United States Patent
Cho et al.

(10) Patent No.: US 7,910,438 B2
(45) Date of Patent: *Mar. 22, 2011

(54) METHOD FOR FABRICATING SEMICONDUCTOR DEVICE INCLUDING RECESS GATE

(75) Inventors: Yong-Tae Cho, Kyoungki-do (KR); Jae-Seon Yu, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 634 days.

This patent is subject to a terminal disclaimer.

(21) Appl. No.: 11/824,295

(22) Filed: Jun. 29, 2007

(65) Prior Publication Data

US 2008/0081449 A1    Apr. 3, 2008

(30) Foreign Application Priority Data

Sep. 28, 2006    (KR) .................. 10-2006-0095165

(51) Int. Cl.
*H01L 21/336* (2006.01)
(52) U.S. Cl. .. 438/270; 438/589; 438/700; 257/E21.629
(58) Field of Classification Search .................. 438/212, 438/270–272, 589, 710, 711, 717, 206, 268, 438/430, 696, 700, 735; 257/302, 330–334, 257/E29.321, E21.384, E21.419, E21.428, 257/E21.429, E21.585, E21.586, E21.655, 257/E27.091, E29.201, E21.618, E21.629, 257/E21.633, E21.643
See application file for complete search history.

(56) References Cited

U.S. PATENT DOCUMENTS

| | | | | |
|---|---|---|---|---|
| 5,112,771 | A * | 5/1992 | Ishii et al. ................. | 438/389 |
| 5,892,252 | A * | 4/1999 | Hammond et al. .......... | 257/252 |
| 6,018,174 | A * | 1/2000 | Schrems et al. ............. | 257/296 |
| 6,232,171 | B1 * | 5/2001 | Mei .............................. | 438/246 |
| 6,440,792 | B1 * | 8/2002 | Shiao et al. .................. | 438/243 |
| 6,544,851 | B2 * | 4/2003 | Ponomarev et al. .......... | 438/289 |
| 6,557,967 | B1 * | 5/2003 | Lee .............................. | 347/20 |
| 7,485,557 | B2 * | 2/2009 | Han et al. ...................... | 438/589 |
| 7,492,005 | B2 * | 2/2009 | Chang et al. ................. | 257/330 |
| 7,507,651 | B2 * | 3/2009 | Cho et al. ..................... | 438/585 |
| 7,625,813 | B2 * | 12/2009 | Jung ............................. | 438/589 |
| 7,629,242 | B2 * | 12/2009 | Han et al. ..................... | 438/589 |

(Continued)

FOREIGN PATENT DOCUMENTS

CN    1630040 A    6/2005

(Continued)

OTHER PUBLICATIONS

Taylor et al., "The effect of discharge conditions on the inductively coupled plasma oxidation of silicon", Vacuum, vol. 38, Issues 8-10, 1988, Abstract.*

(Continued)

*Primary Examiner* — Matthew C Landau
*Assistant Examiner* — Joseph C Nicely
(74) *Attorney, Agent, or Firm* — Blakely, Sokoloff, Taylor & Zafman

(57) ABSTRACT

A method for fabricating a semiconductor device includes etching a substrate to form a first trench pattern, forming spacers over sidewalls of the first trench pattern, etching a bottom portion of the first trench pattern using the spacers as a barrier to form a second trench pattern, performing an isotropic etching on the second trench pattern to round sidewalls of the second trench pattern and form a bulb pattern, and forming a gate over a recess pattern including the first trench pattern, the rounded second trench pattern and the bulb pattern.

17 Claims, 7 Drawing Sheets

U.S. PATENT DOCUMENTS

| | | |
|---|---|---|
| 2001/0023960 A1 | 9/2001 | Soga et al. |
| 2003/0211729 A1* | 11/2003 | Lee et al. ............... 438/637 |
| 2005/0020086 A1* | 1/2005 | Kim et al. .............. 438/700 |
| 2005/0279729 A1* | 12/2005 | Okulan et al. .............. 216/11 |
| 2006/0011579 A1* | 1/2006 | Ko ............................. 216/67 |
| 2006/0113590 A1* | 6/2006 | Kim et al. ............... 257/330 |
| 2006/0237817 A1* | 10/2006 | Park ........................ 257/500 |
| 2006/0246730 A1* | 11/2006 | Kim et al. ............... 438/700 |
| 2007/0020890 A1* | 1/2007 | Thakur et al. .......... 438/478 |
| 2007/0026632 A1* | 2/2007 | Yamamoto .............. 438/424 |
| 2007/0099384 A1* | 5/2007 | Han et al. ............... 438/270 |
| 2007/0105388 A1* | 5/2007 | Lee et al. ............... 438/710 |
| 2007/0111469 A1* | 5/2007 | Kim et al. ............... 438/424 |
| 2007/0123014 A1* | 5/2007 | Han et al. ............... 438/585 |
| 2007/0148934 A1* | 6/2007 | Cho et al. ............... 438/585 |
| 2007/0224763 A1* | 9/2007 | Fujimoto et al. ....... 438/259 |
| 2009/0130852 A1* | 5/2009 | Kewley .................... 438/694 |
| 2009/0236684 A1* | 9/2009 | Lee .......................... 257/510 |
| 2010/0024186 A1* | 2/2010 | Bailey, III ............ 29/402.04 |
| 2010/0038796 A1* | 2/2010 | Wilson .................... 257/773 |

FOREIGN PATENT DOCUMENTS

| | | |
|---|---|---|
| JP | 61-032569 | 2/1986 |
| KR | 10-2005-0011376 A | 1/2005 |
| KR | 1020060079331 A | 7/2006 |
| KR | 10-0700332 B1 | 3/2007 |
| KR | 10-2007-0069815 A | 7/2007 |
| TW | 200520071 | 6/2005 |

OTHER PUBLICATIONS

Quirk et al., "Semiconductor Manufacturing Technology", 2001, pp. 450.*

* cited by examiner

METHOD FOR FABRICATING SEMICONDUCTOR DEVICE INCLUDING RECESS GATE

CROSS-REFERENCE TO RELATED APPLICATIONS

The present invention claims priority of Korean patent application number 10-2006-0095165, filed on Sep. 28, 2006, which is incorporated by reference in its entirety.

BACKGROUND OF THE INVENTION

The present invention relates to a method for fabricating a semiconductor device, and more particularly, to a method for fabricating a recess gate of a semiconductor device.

In a typical method for forming a planar gate interconnection line by forming a gate over a flat active region, the current large integration scale of semiconductor devices has caused a channel length to be decreased but an implantation doping concentration to be increased. Accordingly, due to an increased electric field, a junction leakage is generated and thus, it becomes difficult to secure a satisfactory refresh property of a device.

A three-dimensional recess gate process has been suggested to overcome the above described limitations. The three-dimensional recess gate process etches a substrate to form a recess and then, forms a gate over the recess. If the recess gate process is applied, a channel length may be increased and an ion doping concentration may be decreased. As a result, a refresh property of a device may be greatly improved.

FIGS. 1A and 1B illustrate a typical method for fabricating a recess gate of a semiconductor device. As shown in FIG. 1A, an isolation structure 12 is formed in certain portion of a substrate 11 to define an active region 13.

The active region 13 of the substrate 11 is etched to form a plurality of bulb-shaped recesses 14. Each of the bulb-shaped recesses 14 include a first portion formed in vertical pattern 14A and a second portion formed in a bulb pattern 14B. In more details about the formation of the bulb pattern 14B, the vertical pattern 14A is formed and then, a plurality of spacers 15 including oxide-based materials are formed over sidewalls of the vertical pattern 14A. A recess etching process is performed using the spacers 15 as an etch barrier to obtain the bulb pattern 14B.

As shown in FIG. 1B, a pad oxide layer (not shown) and the spacers 15 formed over the sidewalls of the vertical pattern 14A are removed. A gate insulation layer 16 is formed over the substrate 11 including the bulb-shaped recesses 14. A polysilicon layer 17 for a gate conductive layer and a gate metal layer 18 are formed to project over the gate insulation layer 16 while filling the recesses 14. As a result, a plurality of recess gates RG are formed.

Since the spacers 15 formed over the sidewalls of the vertical pattern 14A are used as an etch barrier during the etching of the bulb pattern 14B, a horn identified with a reference letter 'A' (see FIG. 1A) may be formed at a portion between the vertical pattern 14A and the bulb pattern 14B during anisotropic etching process.

FIGS. 2A and 2B are transmission electron microscopy (TEM) illustrating a limitation generated during a typical method for fabricating a recess gate. A bulb-shaped recess 24 is formed as shown in FIG. 2A. Although not shown, reference numerals 21, 22, and 23 respectively identify a substrate, an isolation structure, and an active region. As shown in FIG. 2B, a horn identified with a reference letter 'B' may be generated at a portion between a vertical pattern 24A and a bulb pattern 24B of the bulb-shaped recess 24 during anisotropic etching process to form the bulb pattern 24B using a spacer insulation layer 25 formed over sidewalls of the bulb pattern 24A as a barrier.

The horn 'B' is likely to degrade a property of a subsequent gate insulation layer. The horn 'B' becomes a portion at which a stress concentrates, thereby becoming a leakage source. As a result, yields of the device may be decreased.

SUMMARY OF THE INVENTION

Embodiments of the present invention are directed toward providing a method for fabricating a recess gate of a semiconductor device capable of reducing generation of a leakage current and property degradation in a gate insulation layer by rounding a portion between a vertical pattern and a bulb pattern in a bulb-shaped recess gate.

In accordance with one aspect of the present invention, there is provided a method for fabricating a semiconductor device. The method includes etching a substrate to form a first trench pattern, forming spacers over sidewalls of the first trench pattern, etching a bottom portion of the first trench pattern using the spacers as a barrier to form a second trench pattern, performing an isotropic etching on the second trench pattern to round sidewalls of the second trench pattern and form a bulb pattern, and forming a gate over a recess pattern including the first trench pattern, the rounded second trench pattern and the bulb pattern.

In accordance with another aspect of the present invention, there is provided a method for fabricating a semiconductor device. The method includes etching a substrate to form a first trench pattern, forming spacers over sidewalls of the first trench pattern, etching a bottom portion of the first trench pattern using the spacers as a barrier to form a second trench pattern, performing a plasma oxidation on a surface of the second trench pattern to make sidewalls of the second trench pattern rounded, forming a bulb pattern connected to the first trench pattern through the rounded second trench pattern, and forming a gate over a recess pattern including the first trench pattern, the rounded second trench pattern and the bulb pattern.

DESCRIPTION OF SPECIFIC EMBODIMENTS

Figure 1A:
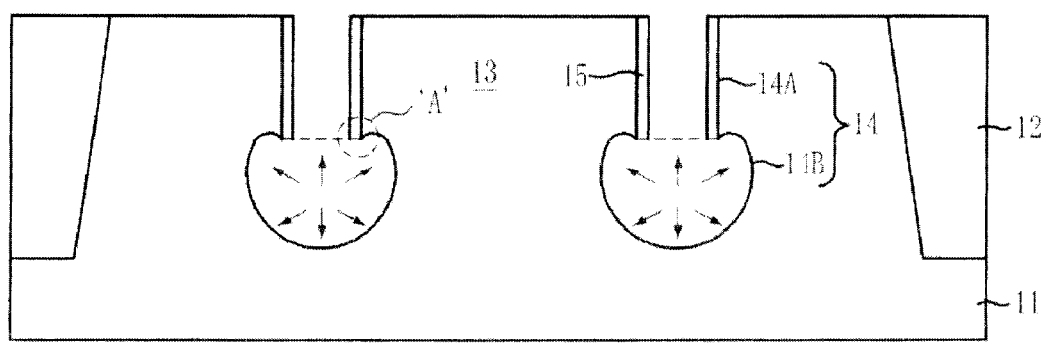
FIGS. 1A and 1B illustrate a typical method for fabricating a recess gate of a semiconductor device.
Figure 1B:
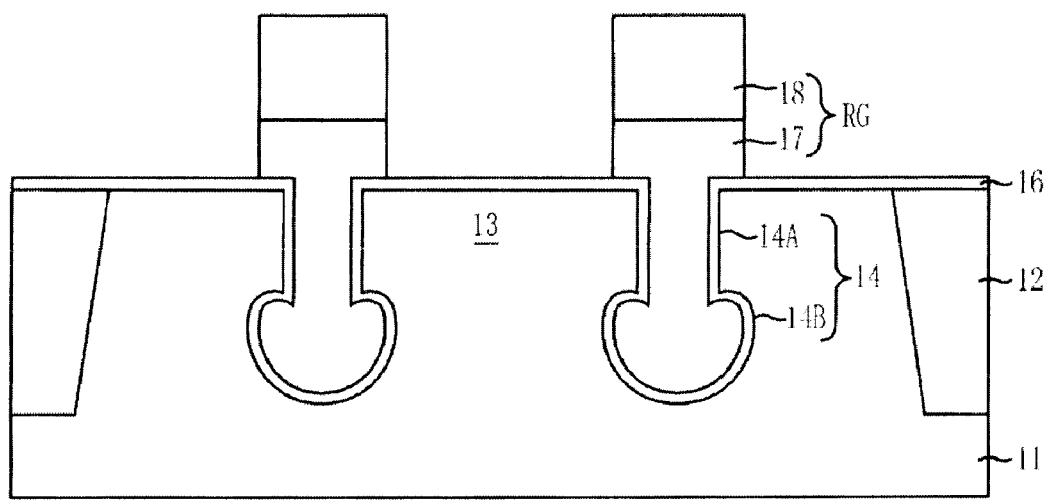
Figure 2A:
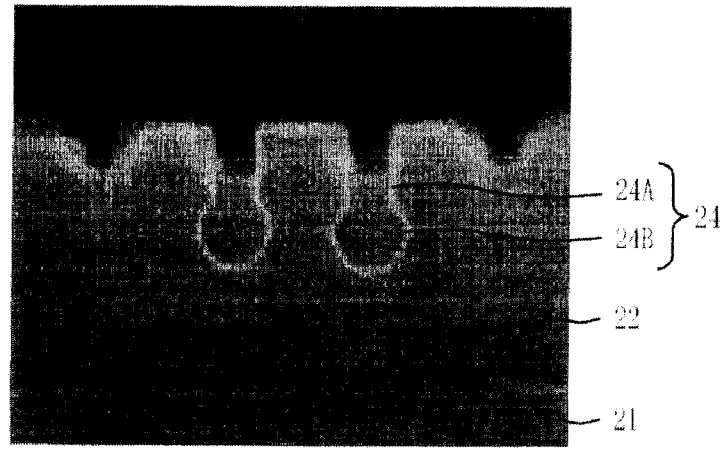
FIGS. 2A and 2B illustrate transmission electron microscopy (TEM) illustrating a limitation caused by applying a typical method for fabricating a recess gate.
Figure 2B:
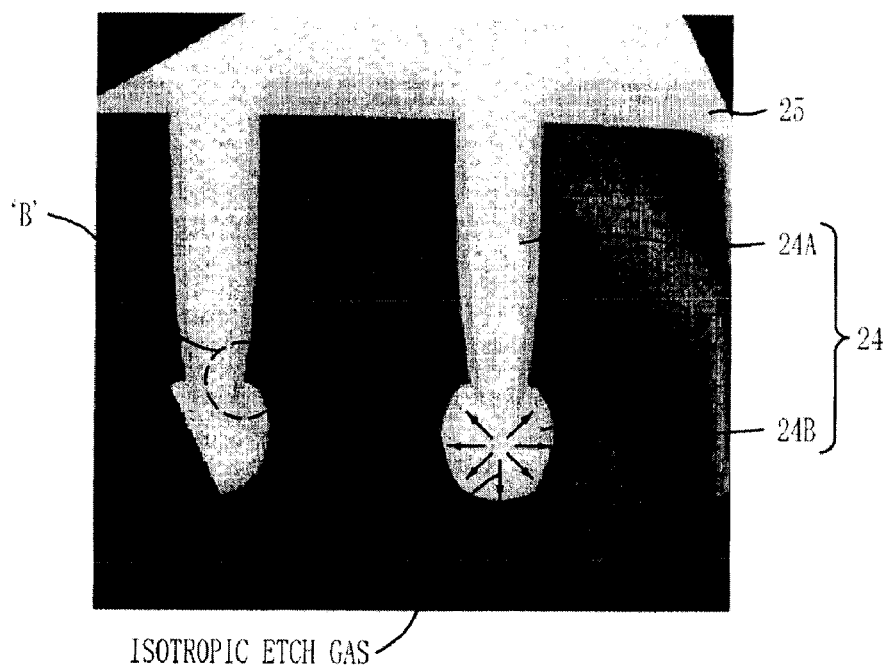
Figure 3A:
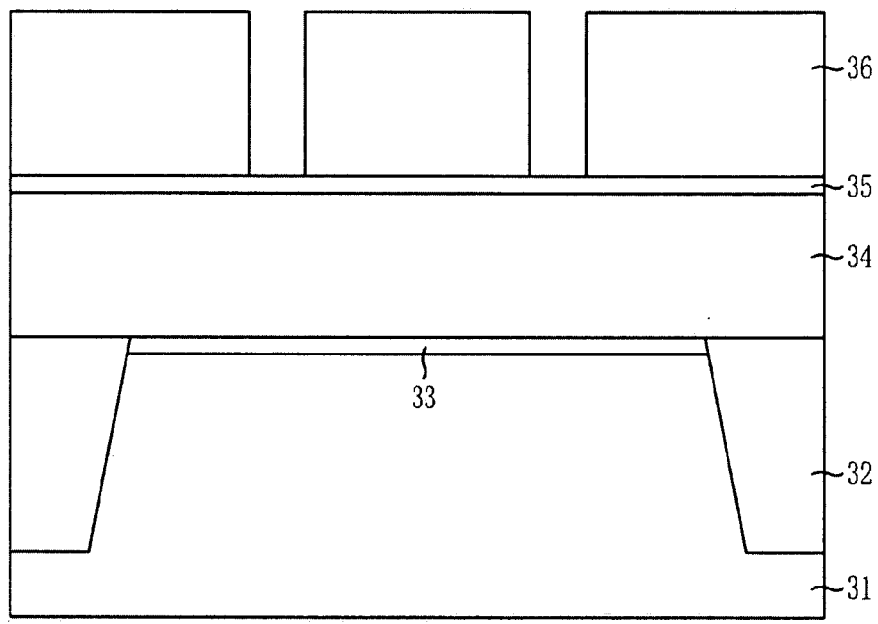
FIGS. 3A to 3H illustrate a method for fabricating a recess gate in accordance with an embodiment of the present invention.

FIGS. 3A to 3H illustrate a method for fabricating a recess gate in accordance with an embodiment of the present invention. As shown in FIG. 3A, an isolation structure 32 is formed in a certain portion of a semi-finished substrate 31 via a shallow trench isolation (STI) process. A polysilicon layer 34 for a hard mask is formed over the semi-finished substrate 31. A pad oxide layer used during the STI process remains below the polysilicon layer 34. The pad oxide layer is referred to as an oxide layer 33 for a hard mask.

An anti-reflective coating layer 35 is formed over the polysilicon layer 34, and a photoresist pattern 36 is formed over a certain portion of the reflective coating layer 35.

Figure 3B:
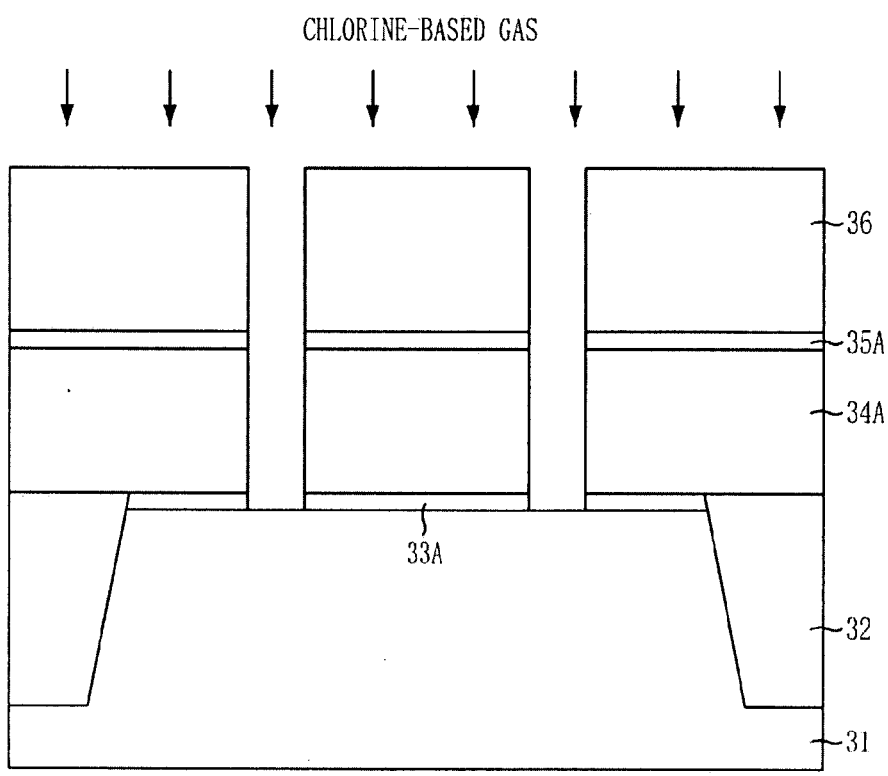

As shown in FIG. 3B, the anti-reflective coating layer 35, the polysilicon layer 34 and the oxide layer 33 are etched to expose a surface of the semi-finished substrate 31 using the photoresist pattern 36 as an etch barrier. The etching of the anti-reflective coating layer 35, the polysilicon layer 34 and the oxide layer 33 includes using a transformer coupled plasma (TCP) or inductively coupled plasma (ICP) type source. A chlorine-based gas is implanted and then, a source power and a bias power are added. For instance, the chlorine-based gas includes a $Cl_2$ gas. As a result, an oxide hard mask pattern 33A, a polysilicon hard mask pattern 34A, and an anti-reflective coating pattern 35A are formed. In this manner, the hard mask pattern includes a stack structure of the oxide layer and the polysilicon layer.

Figure 3C:
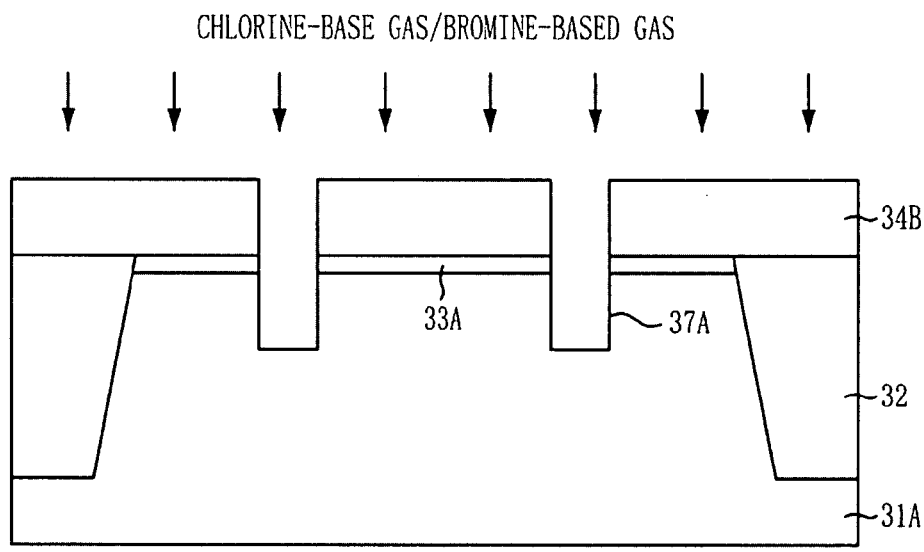

As shown in FIG. 3C, the photoresist pattern 36 is removed. When the photoresist pattern 36 is removed, most of the anti-reflective coating pattern 35A is also removed. The anti-reflective coating pattern 35A which may remain is completely removed during a subsequent etching process using the polysilicon hard mask pattern 34A. The semi-finished substrate 31 is etched using the polysilicon hard mask pattern 34A to form a first trench pattern 37A. The first trench pattern has a vertical sidewall profile. A reference numeral 31A identifies a first patterned substrate.

The etching process to form the first trench pattern 37A is performed at an etcher using a TCP or ICP type source. The etching process to form the first trench pattern 37A includes using a pressure ranging from about 20 mTorr to about 80 mTorr, a source power ranging from about 400 W to about 1,000 W, and a bias power ranging from about 100 W to about 400 W. As an etch gas, a small flow rate of an oxygen ($O_2$) gas is added to a gas mixture including a chlorine-based gas and a bromine-based gas. The chlorine-based gas includes $Cl_2$ with a flow rate ranging from about 30 sccm to about 100 sccm. The bromine-based gas includes hydrogen bromide (HBr) with a flow rate ranging from about 30 sccm to about 100 sccm. The $O_2$ gas flows at a lower rate than those of the chlorine-based gas and the bromide-based gas. For instance, the $O_2$ gas flows at a flow rate less than about 30 sccm.

The first trench pattern 37A of which sidewalls are formed in a vertical profile corresponds to an upper portion of each bulb-shaped recess pattern to be finally formed. A depth of the first trench pattern 37A can be defined for each type of bulb-shaped recess patterns to be formed. While forming the first trench pattern 37A, a portion of the polysilicon hard mask pattern 34A is removed. Accordingly, a remaining portion of the polysilicon hard mask pattern 34A is referred to as a first polysilicon hard mask pattern identified by a reference numeral 34B.

Figure 3D:
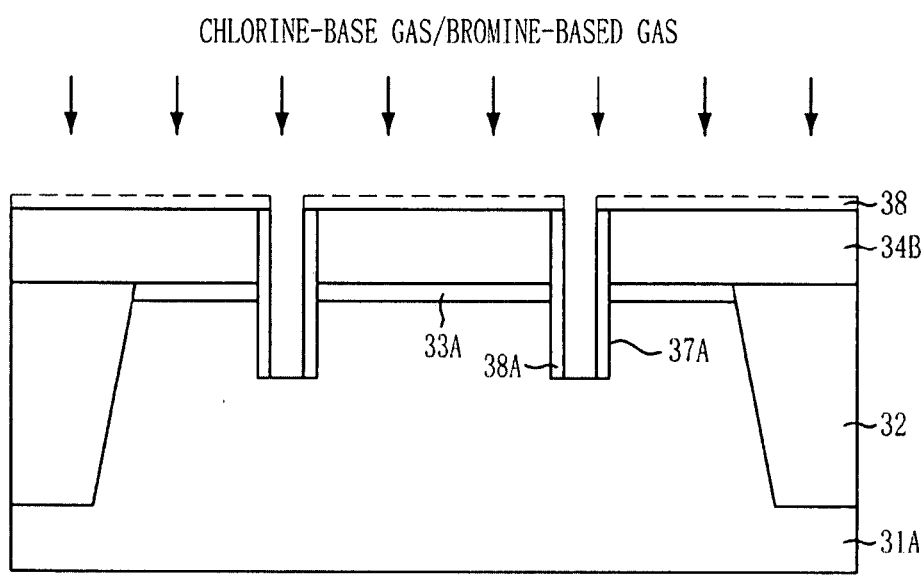

As shown in FIG. 3D, a spacer layer 38 is formed over an upper portion of the resultant structure including the first polysilicon hard mask pattern 34B. The spacer layer 38 is formed to a thickness ranging from about 50 Å to about 100 Å at a temperature ranging from about 500° C. to about 700° C. The spacer layer 38 includes an oxide-based material.

The reason why the spacer layer 38 includes the oxide-based material is because the pad oxide layer, which is remaining after the STI process, and the spacer layer 38 can be simultaneously removed via a wet etching process after the bulb-shaped recesses are formed. Accordingly, the spacer layer 38 is used for simplicity of the process.

The spacer layer 38 is dry etched to form a plurality of spacers 38A over the sidewalls of the first trench pattern 37A. The spacer layer 38 is etched using an $O_2$ gas and a plasma mixture including a CF-based gas and a CHF-based gas at an etcher using one of TCP and ICP type sources. For instance, the CF-based gas includes tetrafluoromethane ($CF_4$) and the CHF-based gas includes trifluoromethane ($CHF_3$).

Figure 3E:
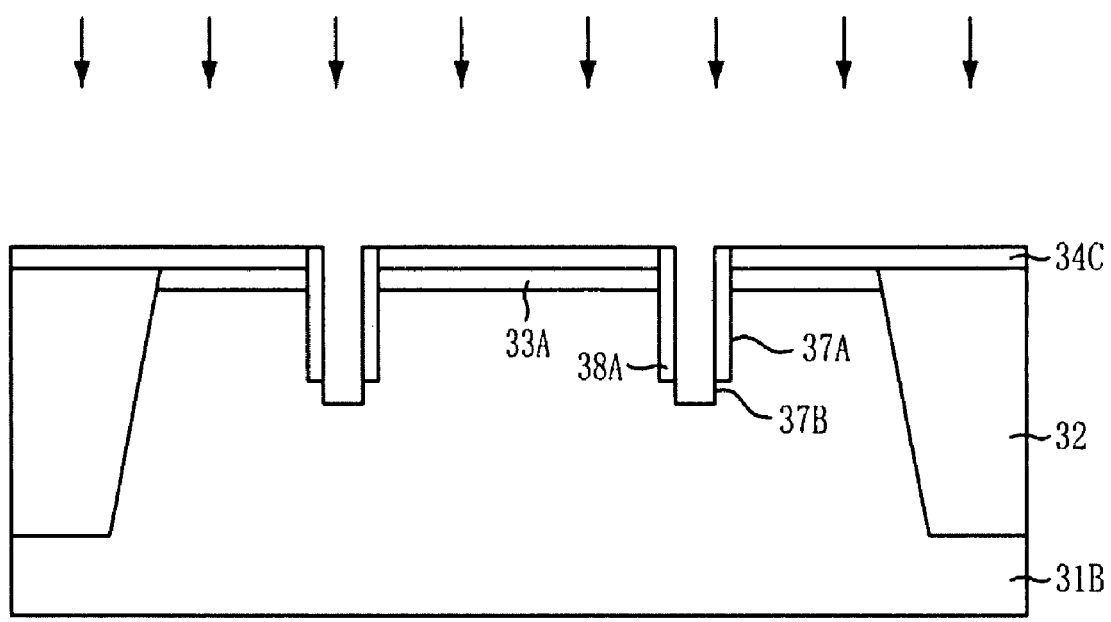

As shown in FIG. 3E, an exposed bottom portion of the first trench pattern 37A is etched to a certain thickness after the spacers 38A are formed. A reference numeral 31B identifies a second patterned substrate. As a result, a second trench pattern 37B is formed. A depth of the second trench pattern 37B is smaller than that of the first trench pattern 37A, and a width of the second trench pattern 37B is smaller than that of the first trench pattern 37A. Since the second trench pattern 37B is formed substantially in the same structure as the first trench pattern 37A (i.e., vertical sidewall profile), a double trench structure including the first trench pattern 37A and the second trench pattern 37B is obtained. The etching process to form the second trench pattern 37B is referred to as a slightly double trench (SDT) etching process.

The etching process performed on the bottom portion of the first trench pattern 37A to form the second trench pattern 37B includes using an etcher using a TCP or ICP type source. A pressure ranging from about 20 mTorr to about 80 mTorr, a source power ranging from about 400 W to about 1,000 W, and an a bias power ranging from about 100 W to about 4,00 W are used. Also, as an etch gas, $O_2$ gas flows at a lower rate than a gas mixture including a chlorine-based gas and a bromine-based gas. For instance, the chlorine-based gas includes $Cl_2$ with a flow rate ranging from about 30 sccm to about 100 sccm. The bromine-based gas includes HBr with a flow rate ranging from about 30 sccm to about 100 sccm. A flow rate of the $O_2$ gas flows is lower than those of the chlorine-based gas and the bromine-based gas. A flow rate of the $O_2$ gas is less than about 30 sccm.

The aforementioned trench type pattern including the first trench pattern 37A and the second trench pattern 37B are completed via the series of processes. A portion of the first polysilicon hard mask pattern 34B is removed. A remaining portion of the first polysilicon hard mask pattern 34B is referred to as a second polysilicon hard mask pattern identified by a reference numeral 34C.

After the second pattern 37B is formed, the spacers 38A formed over portions other than the second polysilicon hard mask pattern 34C, the oxide hard mask pattern 33A, and the first trench pattern 37A are removed. Accordingly, the spacers 38A remain over the sidewalls of the first trench pattern 37A, the second polysilicon hard mask pattern 34C, and the oxide hard mask pattern 33A.

Figure 3F:
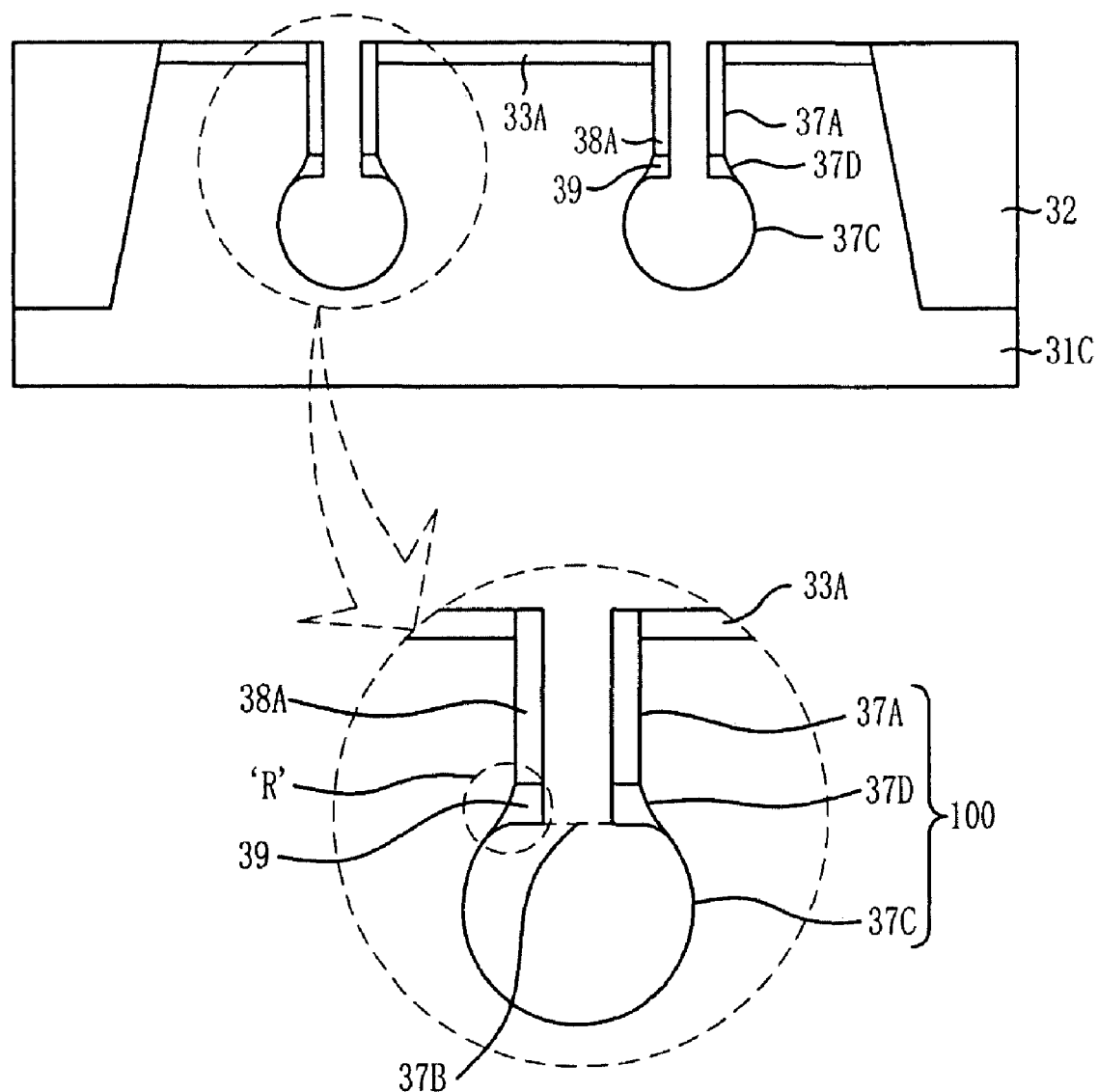

As shown in FIG. 3F, a bottom portion of the second trench pattern 37B is subjected to an isotropic etching process using the spacers 38A as a barrier to form a bulb pattern 37C. A reference numeral 31C identifies a third patterned substrate. The isotropic etching process is performed under conditions of: a pressure ranging from about 20 mTorr to about 100 mTorr; a source power ranging from about 500 W to about 1,500 W; and an etcher with a TCP type source. Also, the isotropic etching process is performed using a power ranging from about 300 W to about 3,000 W and an etcher with one selected from a group consisting of a TCP type source in which a faraday shield is installed, an ICP type source, a microwave down stream (MDS) type plasma source, and electron cyclotron resonance (ECR) type plasma source, and a helical type plasma source.

While the isotropic etching process is performed using one of the above listed etchers, a gas mixture including $CF_4$, He, and $O_2$ gases is used as an etch gas. In the case of the etcher using the TCP type source, $CF_4$, He, and $O_2$ gases are mixed with flow rates of $CF_4$, He and $O_2$ gases ranging between about 30 sccm and 80 sccm, between about 50 sccm to about 300 sccm, and between about 10 sccm to about 50 sccm, respectively. The $CF_4$ and $O_2$ gases etch the second patterned substrate 31B while oxidizing the surface of the etched second patterned substrate 31B. In the case of the etcher using the ICP type source in which the faraday shield is installed, the MDS type plasma source, the ECR type plasma source, or the helical type plasma source, $CF_4$, He, and $O_2$ gases are mixed in a ratio of about 12 parts of $CF_4$:about 100 parts of He:about 30 parts of $O_2$.

Since the isotropic etching process has a chemical dry etch property, the bulb pattern 37C has a round profile which is different from the profiles of the first and second trench patterns 37A and 37B. During the isotropic etching process, a mixing ratio of the gas mixture including $CF_4$, He, and $O_2$ gases is adjusted to perform a plasma oxidation simultaneously with the etching of the second patterned substrate 31B.

For instance, if the second patterned substrate 31B is etched to a thickness raging from about 300 Å to about 500 Å to form the bulb pattern 37C, the plasma oxidation is performed over a surface of the second trench pattern 37B formed between the first trench pattern 37A and the bulb pattern 37C simultaneously with the etching of the second patterned substrate 31B. As a result, an oxide layer 39 is formed. Due to the formation of the oxide layer 39, the sidewalls of the second trench pattern 37B become rounded (see reference denotation 'R' of FIG. 3F). Hereinafter, the second trench pattern having the rounded sidewalls will be referred to a rounded second trench pattern 37D.

The oxide layer 39 can be formed via the following method to form the rounded second trench pattern 37D. Prior to performing the etching process to form the bulb pattern 37C, the plasma oxidation is performed with an etcher using one selected from a group consisting of an ICP type source in which a faraday shield is installed, a MDS type plasma source, an ECR type plasma source, and a helical type plasma source. The plasma oxidation also includes using a gas mixture of $CF_4$, He, and $O_2$ mixed in a ratio of about 1 part of $CF_4$:about 10 parts of He:about 250 pats of $O_2$. As a result, a silicon crystalline structure of the sidewalls of the second trench pattern 37B is oxidized to form the oxide layer 39 with a thickness less than about 20 Å. For instance, a thickness of the oxide layer 39 ranges from about 5 Å to about 20 Å. Using the gas mixture of $CF_4$, He and $O_2$ gases mixed in the aforementioned ratio of about 1:10:250 favors the plasma oxidation over the isotropic etching. Thus, the oxide layer 39 is first formed, and the sidewalls of the second trench pattern 37B become rounded, forming the rounded second trench pattern 37D. Afterwards, the bulb pattern 37C is formed by performing the isotropic etching process under the above mentioned conditions.

As described above, if the rounded second trench pattern 37D is formed by rounding the sidewalls of the second trench pattern 37B through the formation of the oxide layer 39, a horn which may be generated at a portion between the first trench pattern 37A and the bulb pattern 37C is removed, thereby reducing a gate leakage. The first trench pattern 37A, the bulb pattern 37C, and the rounded second trench pattern 37D form a bulb-shaped recess structure 100.

During the etching process to form the bulb pattern 37C, an etch gas including $Cl_2$ or HBr with a silicon etch target is added to the gas mixture including $CF_4$, He and $O_2$ gases. A flow rate of the $Cl_2$ or HBr gas corresponds to about one fifth to one third of that of the $CF_4$ gas. Accordingly, the bulb pattern 37C having a high selectivity to the spacers 38A can be formed without causing etch loss of inside and outside of the bulb-shaped recess structure 100. As a result, uniformity of the bulb pattern 37C can be secured.

While forming the bulb pattern 37C, the second polysilicon hard mask pattern 34C is removed and thus, does not remain. The oxide hard mask pattern 33A disposed below the second polysilicon hard mask pattern 34C reduces surface loss of the second patterned substrate 31B which may be cased by the etching process to form the bulb pattern 37C.

Figure 3G:
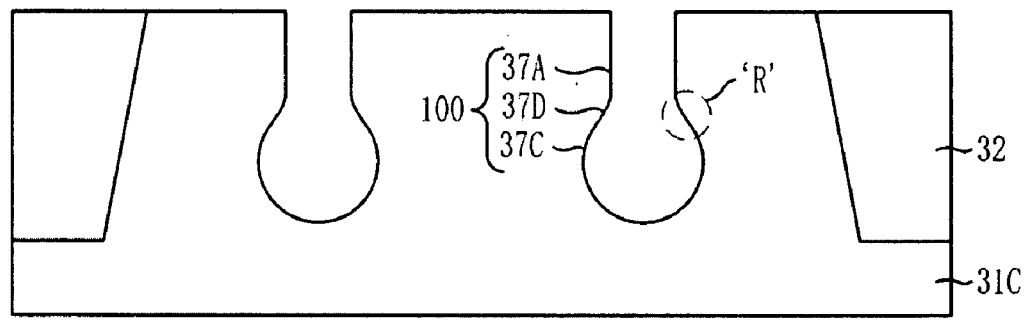

As shown in FIG. 3G, a cleaning process such as an isotropic etching process (e.g., wet etching) is performed using a chemical including a hydrogen fluoride (HF) solution to remove the oxide hard mask pattern 33A, the spacers 38A and the oxide layer 39. Although forming the spacers 38A, the rounded second trench pattern 37D, and the hard mask pattern 33A with an oxide-based material are exemplified in the present embodiment, it is possible to use other types of materials that show substantially the same or similar etch characteristic can still be used for the spacers 38A, the rounded second trench pattern 37D, and the hard mask pattern 33A.

Figure 3H:
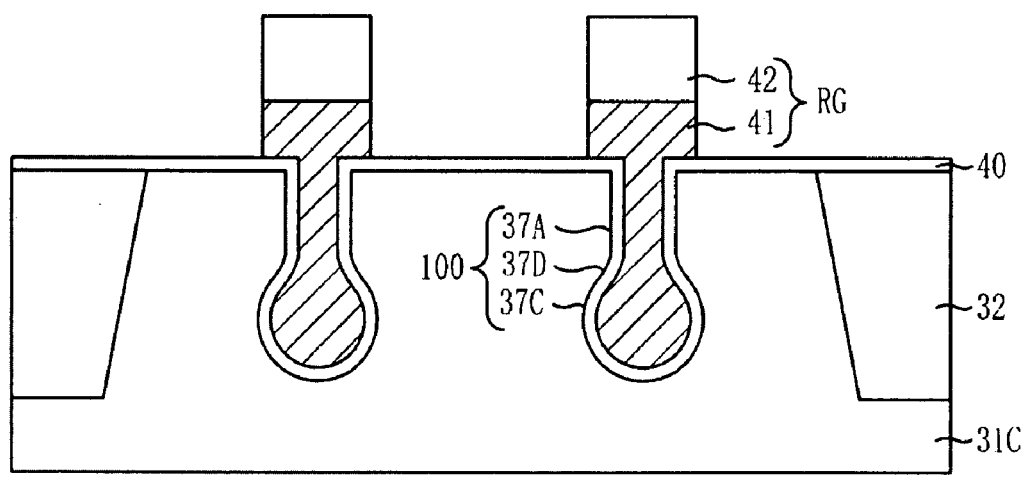

As shown in FIG. 3H, a gate insulation layer 40 is formed over the third patterned substrate 31C including the bulb-shaped recess structure 100. A gate conductive layer and a gate metal layer are formed over the gate insulation layer 40, filling the bulb-shaped recess structure 100. The gate conductive layer includes a polysilicon layer, and the gate metal layer includes tungsten. Then, a gate patterning process is performed to obtain a patterned gate conductive layer 41 and a patterned gate metal layer 42. As a result, a plurality of bulb-shaped recess gates RG, each formed by stacking the patterned gate conductive layer 41 and the patterned gate metal layer 42 are formed on the gate insulation layer 40.

In the above embodiment, the isotropic etching or plasma oxidation can be performed directly after the formation of the first trench pattern 37A without forming the second trench pattern. However, in such a case, rounding the sidewalls of the second trench pattern is often difficult and horns are generated excessively. Thus, after the formation of the second trench pattern, the isotropic etching is performed to form the bulb pattern 37C or the plasma oxidation is performed, followed by the isotropic etching, so as not to generate undesired horns.

As described above, a channel length is increased by the formation of the bulb-shaped recess structure 100. Accordingly, the large integration scale of the semiconductor device does not affect the channel length. The second trench pattern 37B formed between the first trench pattern 37A and the bulb pattern 37C is rounded. As a result, a horn cannot be formed, thereby reducing a gate leakage. In addition, a silicon etch gas including $Cl_2$ or HBr gases is added to a gas mixture including $CF_4$, He and $O_2$ gases used during the forming of the bulb pattern 37C. Accordingly, a shape of the bulb pattern 37C can be more secured.

According to this embodiment of the present invention, the plasma oxidation is performed simultaneously with the performing of the isotropic etching to form the bulb pattern. As a result, the second trench pattern formed between the first pattern and the bulb pattern is rounded, thereby reducing a leakage current that may be caused by a horn.

A channel length of a recess gate can be increased and an ion doping concentration can be reduced. Accordingly, a refresh property of a device can be improved. In addition, a process margin can be maximized by securing a design rule. As a result, the integration scale of the semiconductor device including logic circuits can be increased and yields of the products can be increased. A fabrication cost can be reduced.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
    etching a substrate to form a first trench pattern;
    forming spacers over sidewalls of the first trench pattern;
    etching a bottom portion of the first trench pattern using the spacers as a barrier to form a second trench pattern;
    performing a plasma oxidation to oxidize a silicon crystalline structure of sidewalls of the second trench pattern and form an oxide layer
    performing an isotropic etching on the second trench pattern to round sidewalls of the second trench pattern;
    performing a cleaning process to remove the spacers and the oxide layer and form a bulb pattern; and
    forming a gate over a recess pattern including the first trench pattern, the rounded second trench pattern and the bulb pattern.

2. The method of claim 1, wherein performing the isotropic etching on the second trench pattern comprises using a gas mixture including $CF_4$, He and $O_2$.

3. The method of claim 2, wherein a flow rate of $CF_4$ ranges from about 30 sccm to 80 sccm, a flow rate of He ranges from about 50 sccm to 300 sccm, and a flow rate of $O_2$ ranges from about 10 sccm to 50 sccm.

4. The method of claim 2, wherein the $CF_4$, He, and $O_2$ are mixed in a ratio of about 12 parts of $CF_4$:about 100 parts of He:about 30 parts of $O_2$.

5. The method of claim 2, wherein the gas mixture including $CF_4$, He, and $O_2$ is added with chlorine ($Cl_2$) or hydrogen bromide (HBr) flowing at a rate about one fifth to one third of that of $CF_4$.

6. The method of claim 1, wherein performing the isotropic etching on the second trench pattern comprises using an etcher selected from a group consisting of a transformer coupled plasma (TCP) type source, an inductively coupled plasma (ICP) type source in which a faraday shield is installed, a microwave down stream (MDS) type plasma source, an electron cyclone resonance (ECR) type plasma source, and a helical type plasma source.

7. The method of claim 6, wherein performing the isotropic etching using the TCP type source comprises applying a pressure ranging from about 20 mTorr to 100 mTorr and a source power ranging from about 500 W to 1,500 W.

8. The method of claim 1, wherein each of the first trench pattern and the second trench pattern initially formed has a vertical sidewall profile.

9. The method of claim 8, wherein a width of the first trench pattern is larger than the width of the second trench pattern initially formed and a depth of the first trench pattern is smaller than the depth of the second trench pattern initially formed.

10. The method of claim 1, wherein forming the first trench pattern and the second trench pattern comprises using a gas mixture including $Cl_2$ and HBr added with $O_2$.

11. The method of claim 10, wherein a flow rate of $Cl_2$ ranges from about 30 sccm to 100 sccm, and a flow rate of HBr ranges from about 30 sccm to 100 sccm.

12. The method of claim 10, wherein forming the first trench pattern and the second trench pattern comprises employing an etcher using one of a TCP type source and an ICP type source, a pressure ranging from about 20 mTorr to about 80 mTorr, a source power ranging from about 400 W to about 1,000 W, and a bias power ranging from about 100 W to about 400 W.

13. The method of claim 1, wherein the spacers comprise an oxide-based material.

14. The method of claim 1, wherein etching the substrate comprises using a hard mask pattern as an etch mask, the hard mask pattern including an oxide-based material and a polysilicon-based material.

15. The method of claim 1, wherein the plasma oxidation is performed with an etcher using one selected from a group consisting of an ICP type source in which a faraday shield is installed, a MDS type plasma source, an ECR type plasma source, and a helical type plasma source.

16. The method of claim 15, wherein the plasma oxidation uses a gas mixture of $CF_4$, He, and $O_2$ mixed in a ratio of about 1 part of $CF_4$:about 10 parts of He:about 250 parts of $O_2$.

17. The method of claim 1, wherein the oxide layer has a thickness less than about 20 Å.

* * * * *